US006417560B1

(12) United States Patent
Okawa et al.

(10) Patent No.: US 6,417,560 B1
(45) Date of Patent: Jul. 9, 2002

(54) SEMICONDUCTOR DEVICE

(75) Inventors: Shigeaki Okawa, Tochigi; Toshiyuki Ohkoda, Gunma; Yoshiaki Ohbayashi, Nara; Mamoru Yasuda, Osaka; Shinichi Saeki, Osaka; Shuji Osawa, Osaka, all of (JP)

(73) Assignee: Sanyo Electric Co., Ltd., Osaka (JP)

( * ) Notice: Subject to any disclaimer, the term of this patent is extended or adjusted under 35 U.S.C. 154(b) by 27 days.

(21) Appl. No.: 09/679,117

(22) Filed: Oct. 4, 2000

(30) Foreign Application Priority Data

Oct. 4, 1999 (JP) .......................................... 11-282544

(51) Int. Cl.[7] ............................................. H01L 23/552

(52) U.S. Cl. ....................................... 257/659; 257/532

(58) Field of Search ................................ 257/532, 659, 257/415, 758, 773

(56) References Cited

FOREIGN PATENT DOCUMENTS

JP 11-88992 3/1999

*Primary Examiner*—Mark V. Prenty
(74) *Attorney, Agent, or Firm*—Fish & Richardson P.C.

(57) ABSTRACT

A fixed electrode layer 12 is formed on a semiconductor substrate 11. A vibrating film is formed on the fixed electrode layer through a spacer 14. Since the vibrating film is a light-permeable film, in order to prevent the malfunction of an electronic circuit formed in the semiconductor substrate by incident light, the region where the electronic circuit is to be formed is covered with a shield metal 33.

15 Claims, 6 Drawing Sheets

SEMICONDUCTOR DEVICE

BACKGROUND OF THE INVENTION

1. Field of the Invention

The present invention relates to a semiconductor device used for a capacitor microphone.

2. Description of the Related Art

A portable telephone makes heavy use of electric capacitor microphones (hereinafter referred to as ECMs). An example of such a system is disclosed in JP-A-11-88992. In this example, a fixed electrode layer is formed in an integrated semiconductor substrate and a vibrating film is attached to the fixed electrode layer through a spacer.

The structure of this example is shown in FIG. 6 in which a fixed electrode layer, an insulating film 113, a spacer 114 and a vibrating film are successively stacked on the surface of a silicon semiconductor substrate 111. The resultant laminated structure is mounted in a package 118 having a hole 116. A cloth 117 may be formed as necessary. A junction type FET element for impedance conversion, an amplifier circuit, a noise canceling circuit, etc. are integrated on the surface of the semiconductor circuit by an ordinary semiconductor process. The capacitor formed by the vibrating film 115 and fixed electrode layer changes its own capacitance when air vibration vibrates the vibrating film 115. A change in the capacitance is supplied to the FET element so that it is converted into an electric signal.

In such a configuration, in order to increase the capacitance of the capacitor so that the output electric signal becomes large, the superposed area between the fixed electrode layer 112 and the vibrating film 115 is preferably extended as possible as larger. Therefore, the fixed electrode layer 112 occupies a major area on the semiconductor substrate 111, and the elements to be integrated are arranged in the remaining area.

The capacitor microphone cannot be essentially housed in a completely sealed case. It must have a structure enabling air vibration to reach the vibrating film 115 through the hole 116. To maintain the state where the air vibration can be reached means incapability of completely interrupting light. In addition, the vibrating film is a film not having complete light-shielding characteristics and has a transmittivity of several %.

The circuit elements integrated on the semiconductor substrate 111 involve formation of some PN junctions. When light is incident to the silicon substrate having these PN junctions, a dark current is generated owing to optical electromotive force. The generated dark current flows into the circuit elements, thus leading to sound noise of the ECM and malfunction of the circuit.

SUMMARY OF THE INVENTION

The present invention has been accomplished in view of the problem as described above. An object of the invention is to provide a reliable circuit element capable of preventing malfunction due to a dark current.

In the first invention, the above object is achieved in such a manner that wherein an electronic circuit formed outside a fixed electrode layer is covered with a shield metal.

The second invention is characterized in that the shield metal is formed at the same potential as that at the vibrating film.

The third invention is characterized in that the shield metal is formed to extend from the upper surface of the electronic circuit to a side surface thereof.

The fourth invention is characterized in that the shield metal is in contact with a semiconductor region having one conduction type formed in the surface of the semiconductor substrate and connected to ground potential through the semiconductor substrate.

The fifth invention is characterized in that the the semiconductor device further comprises a shield wiring made of a conductor material formed so as to surround the electronic circuit substantially, an insulating film covering the shield wiring, and an opening in the insulating film which exposes a surface of the shield wiring, wherein the shield metal is electrically connected to the shield wiring through the opening.

The sixth invention is characterized in that the shield wiring is a conductive film filled in a through-hole formed in a second insulating film covering the surface of the semiconductor substrate, the shield wiring being formed in a line so as to surround at least an inside region of the electronic circuit.

The seventh invention is characterized in that the shield wiring is a conductive film filled in a through-hole formed in a second insulating film covering the surface of the semiconductor substrate, the shield wiring being formed in a line so as to surround at least an outside region of the electronic circuit.

The eighth invention is characterized in that the shield wiring is a conductive film filled in a through-hole formed in a second insulating film covering the surface of the semiconductor substrate, the shield wiring being formed in a line so as to surround at least an outside region of the electronic circuit.

The ninth invention is characterized in that the fixed electrode layer is arranged substantially centrally on the semiconductor substrate; the shield wiring is composed of an electrode wiring for connecting circuit elements of the electronic circuit to one another and a wiring layer on the same level as the electrode wiring so that it substantially surrounds the electronic circuit.

The tenth invention is characterized in that a surface of the shield wiring is covered with an insulating film, the shield wiring being electrically connected to the shield metal through the opening formed in the insulating film.

The eleventh invention is characterized in that it comprises a semiconductor substrate, a fixed electrode layer arranged substantially centrally on the semiconductor substrate, an electronic circuit located outside the fixed electrode layer, an electrode wiring for connecting circuit elements of the electronic circuit; a shield wiring on the same level as the layer where wirings constituting the electronic circuit and substantially encircling the electronic circuit; an insulating film in which the shield wiring is exposed; a shield metal which is connected to the shield wiring through an exposed area of the shield wiring and covers the electronic circuit; and a spacer for attaching a vibrating film which constitutes a capacitor in a pair with the fixed electrode layer.

The twelfth invention is characterized in that it further comprises: a pad electrode serving as an external electrode of the electronic circuit and the shield metal is partially removed above the pad electrode.

The thirteenth invention is characterized in that the shield metal is made of an Al—Si film.

The fourteenth invention is characterized in that the shield metal is connected to ground potential GND.

The fifteenth invention is characterized in that it comprises: a fixed electrode layer formed on a surface of a semiconductor substrate, an electronic circuit formed on the surface of the semiconductor substrate on the periphery of the fixed electrode layer, and a spacer for attaching a vibrating film which constitutes a capacitor in a pair with the fixed electrode layer, and in that a surface of the semiconductor substrate corresponding to a region where the electronic circuit is formed is covered with an insulating film and the electronic circuit is covered with a shield metal formed on the insulating film; and the same material as the shield metal is continuously extended to the surface of the semiconductor substrate so as to surround the region where the electronic circuit is formed.

For example, in the case of a two-layer metallic wiring, the shield wiring, a through-hole which exposes it and a shield metal can completely shield the electronic circuit.

The above and other objects and features of the invention will be more apparent from the following description taken in conjunction with the accompanying drawings.

DESCRIPTION OF THE PREFERRED EMBODIMENTS

Figure 1:
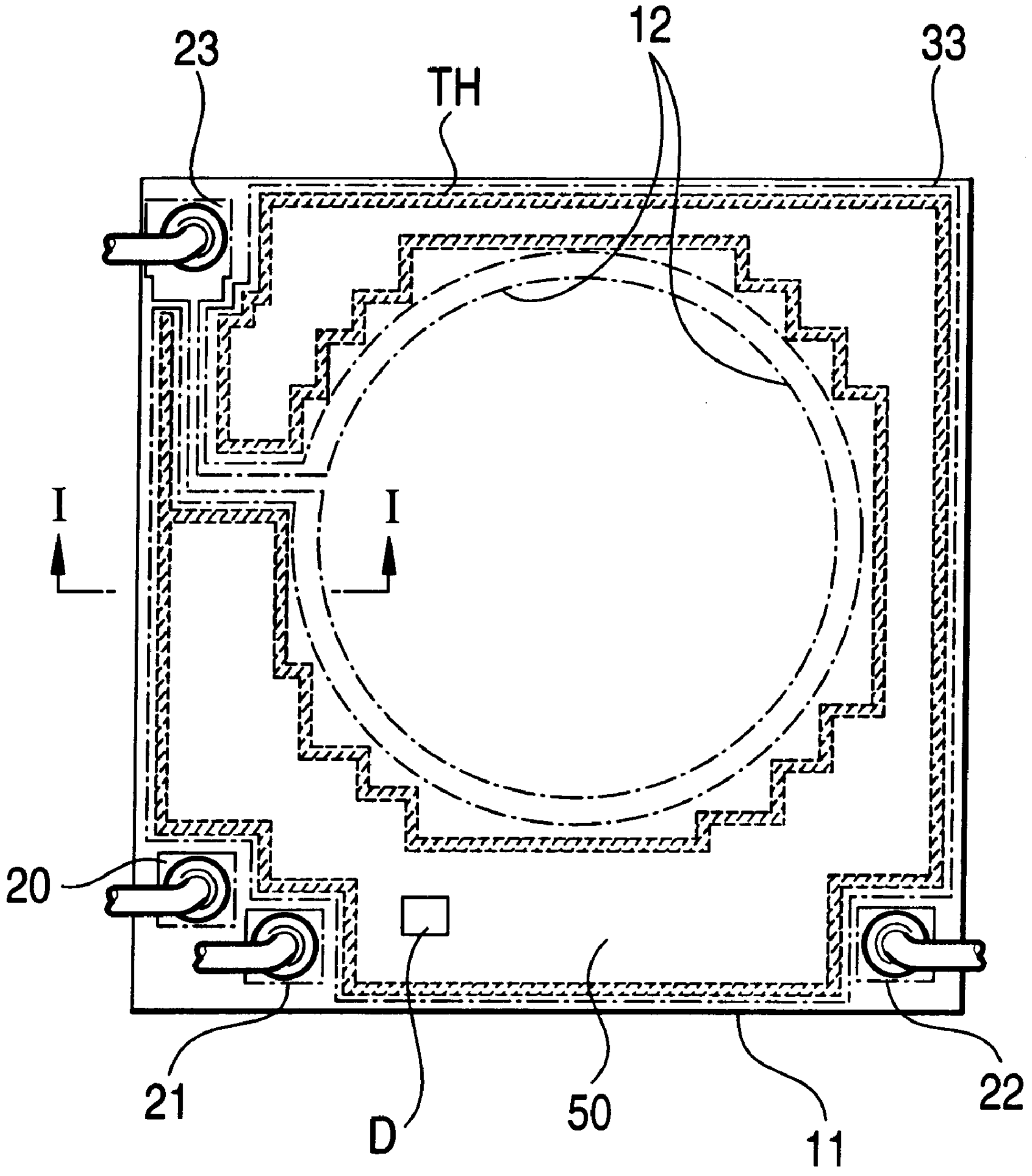
FIG. 1 is a plan view of a semiconductor device according to the invention.

Now referring to the drawings, an explanation will be given of embodiments of the invention.

Figure 2:
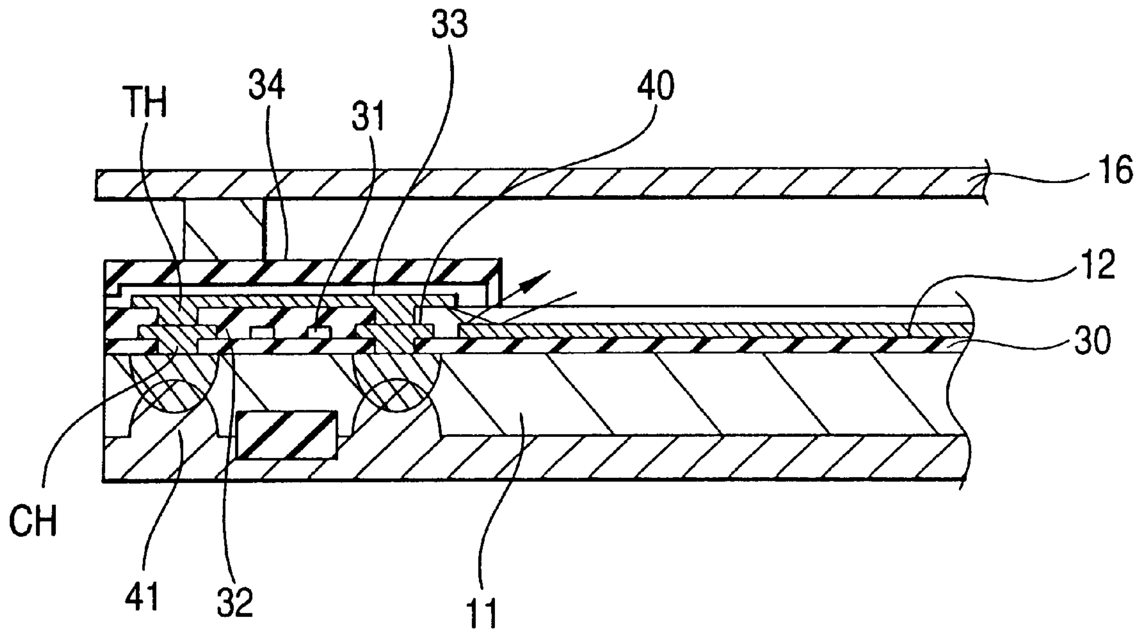
FIG. 2 is a sectional view taken in line I—I in FIG. 1.
Figure 3A:
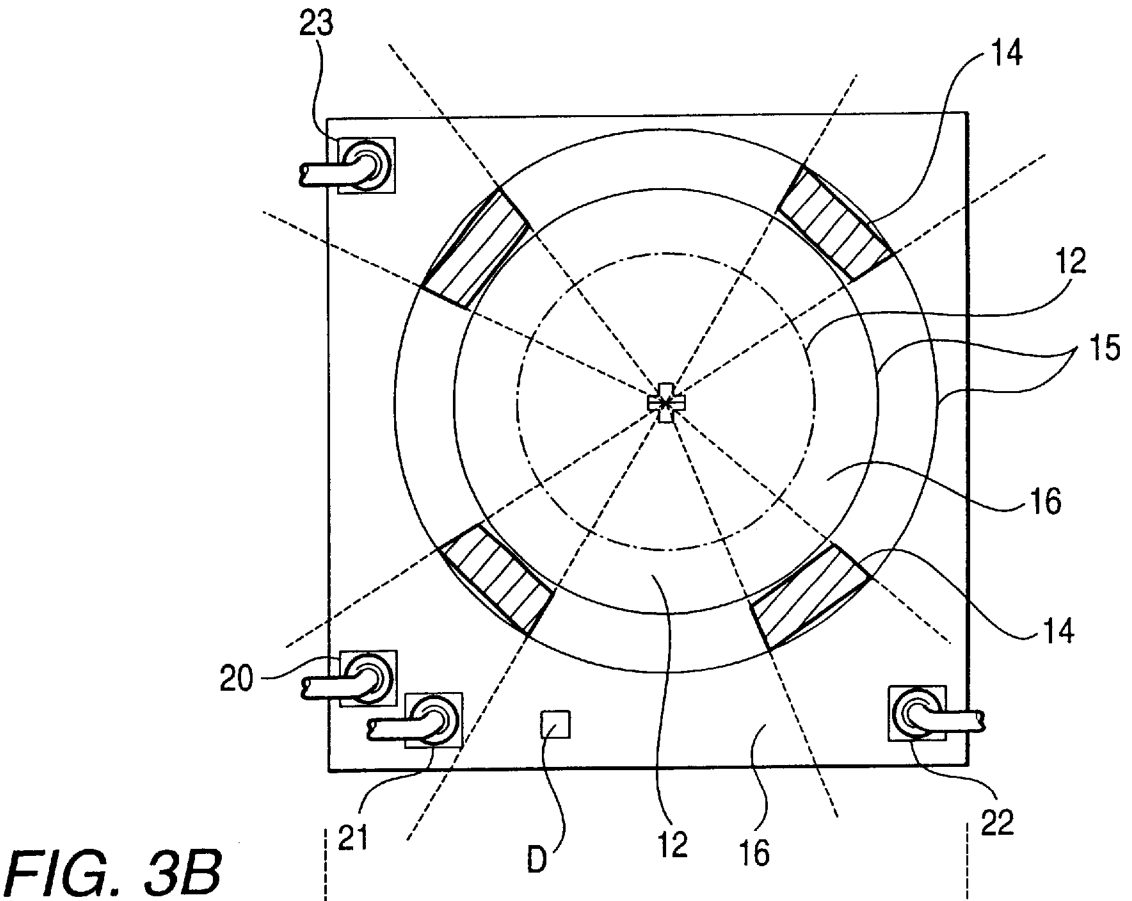
FIGS. 3A and 3B are a plan view and a sectional view showing the state of the semiconductor device equipped with a vibrating film.
Figure 3B:
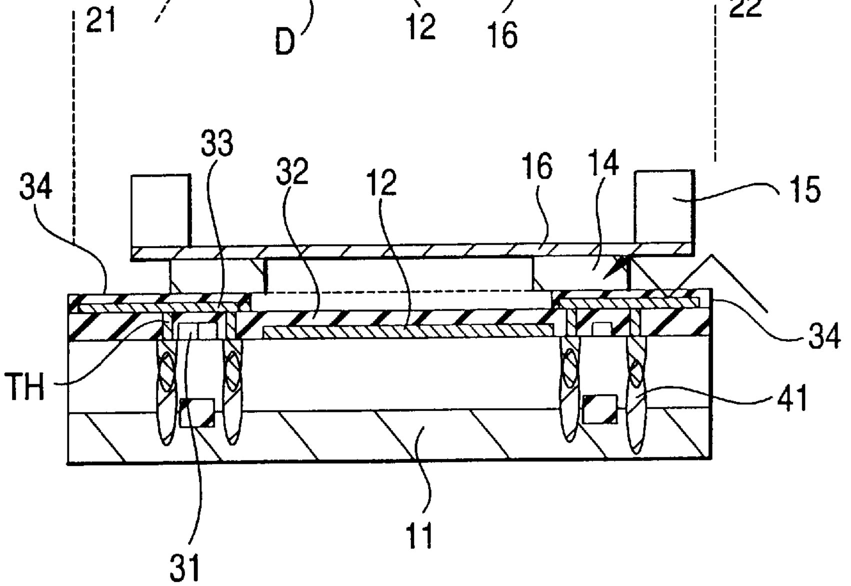

FIG. 1 shows the location of a shield metal. FIGS. 2 and 3 show views each showing the attached state of a vibrating film. First, referring to FIGS. 3A and 3B, an explanation will be given of the overview of the semiconductor device according to the invention.

A circular fixed electrode layer 12 is formed on the surface of a semiconductor substrate 11 having a size of about 2×2 mm. It is illustrated in one-dot chain line. On the surface of the semiconductor substrate 11 around the fixed electrode layer 12, a junction-type or MOS type FET element D for impedance conversion, a bipolar type and/or MOS type active element, a passive element such as a resistor, etc. are integrated through an ordinary semiconductor manufacturing process so that an integrated circuit including an amplifier circuit and noise cancel circuit as well as the FET element are constituted. On the outer periphery of the semiconductor substrate 11, pad electrodes 20 to 23 are arranged for making input/output between the integrated circuit and an external circuit. In this example, the electrode pad has a size of about 0.12 mm×0.12 mm.

As seen from FIG. 3B, a shield metal 33 is formed to surround the periphery of the fixed electrode layer 12 and cover the major area on the periphery where the electronic circuit is formed. A passivation film 34 of e.g. PIX, $Si_3N_4$, etc. is formed on the shield metal 33. The shield metal 33 has a thickness of 1.4 $\mu$ is made of an alloy of Al—Si. The material to be used should not be limited to these materials, but it is needless to say that the conductive material and insulating material which are used ordinarily can be selected according to several requirements and conditions.

The shield metal 33, which has conductivity, produces parasitic capacitance when it is located on the fixed electrode layer 12. The passivation film 34 increases the thickness of dielectric as a capacitor. In order to obviate such inconvenience, the passivation film 34 and the shield metal 33 are removed from above the fixed electrode layer 12.

The shield metal 33 is provided to shade the light externally entering and is made of an alloy of Al—Si in this embodiment. This material may be any material as long as it is conductive. The shield metal is connected to ground.

Spacers 14 are arranged on the passivation film 34. Each spacer 14 is made of light-sensitive resin, e.g. polyimide and is patterned by photolithography. In this embodiment, the spacer 14 has a thickness of 13 $\mu$m after it has been baked.

A vibrating film 16, which is spaced apart by a certain distance from the fixed electrode layer 12 by the spacers 14, is attached, together with a frame 15, onto the semiconductor substrate 11. The vibrating film 16 is a polymeric film (e.g. FEP or PFA) with Ni, Al or Ti deposited on the one face (rear face in this embodiment). The vibrating film 16 has a thickness of 5–12.5 $\mu$m and a circular shape.

In an actual manufacturing process, a circuit element to be formed in the surface of the semiconductor substrate 11, an insulating film and an electrode wiring covering the surface of the semiconductor substrate, the shield metal 33 and spacers 34 are formed on a semiconductor wafer through the ordinary semiconductor process. Thereafter, the semiconductor wafer is divided into individual chips. The vibrating film 16 equipped with the frame 15 is attached to each chip. The semiconductor wafer can be divided into the respective chips by e.g. a dicing apparatus. In this way, the vibrating film is attached to the semiconductor chip after the wafer is divided into the chips. This intends to avoid the damage by the dicing on the vibrating film 16 and prevent dicing dust to enter from between the spacers 14 into the fixed electrode layer 12.

Figure 4:
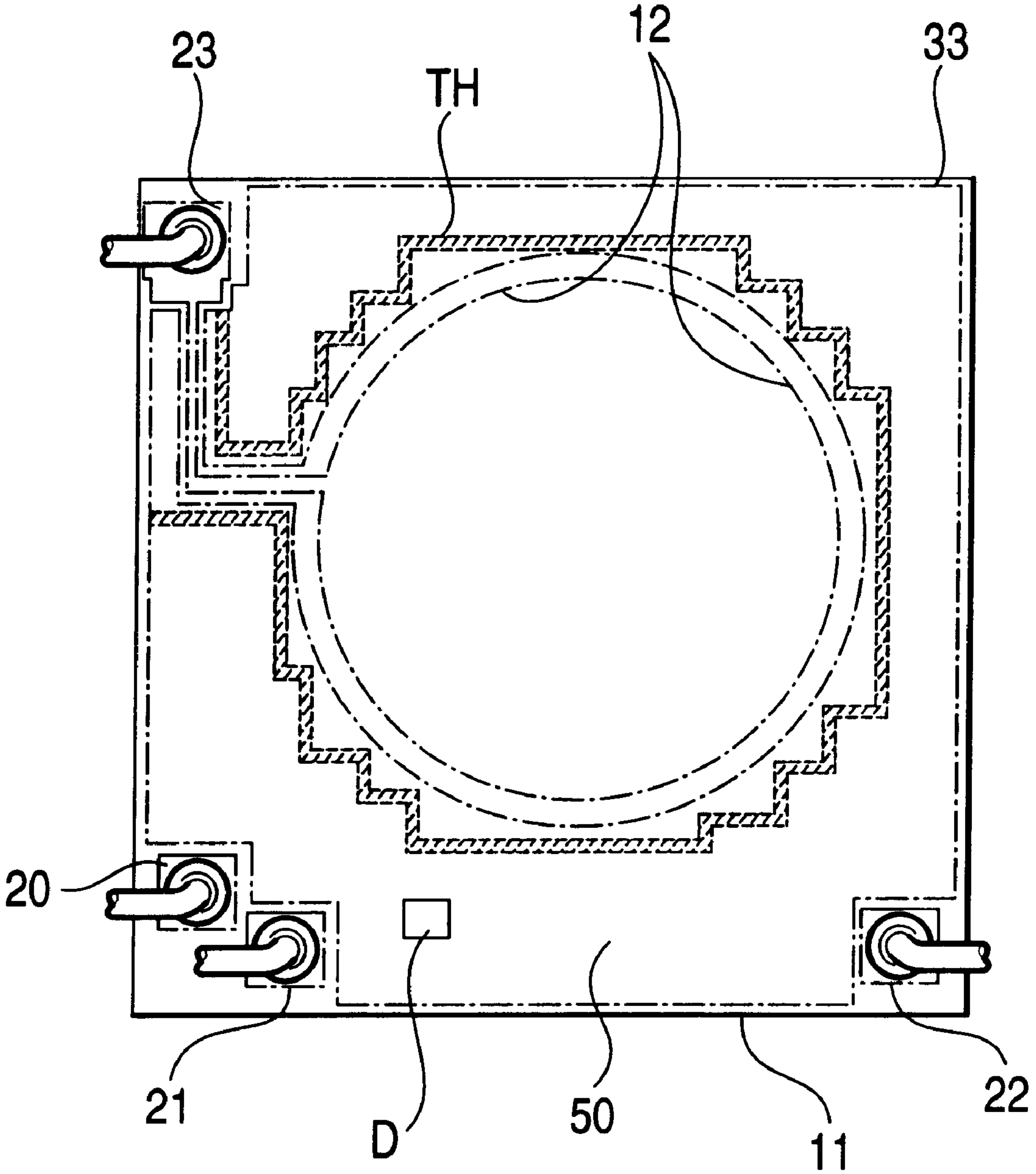
FIG. 4 is a plan view of a modification of the semiconductor device according to the invention.

As seen from FIG. 4, the semiconductor device equipped with the vibrating film 16 is mounted within a package (can) 118. The electrode pads 20–23 are electrically connected to the electrodes formed in the package 118 through metallic wires. It is of course that the electrodes within the package 118 are extended externally from the package and fixed to the electrodes on a mounting board. The mounting board may be a printed board, a ceramic board, etc. A hole 116 is formed on the upper face of the package 118 and a cloth is further bonded thereon as necessary. Alternatively, the semiconductor substrate to which the vibrating film 16 equipped with the frame 15 is attached may not be mounted within the package 118, but may be directly attached to a mounting board. Incidentally, the pad electrode 21 serves as Vcc, pad electrode 22 serves as GND, pad electrode 20 serves as an output terminal and pad electrode 23 serves as an input terminal.

As seen from FIG. 2, the lower part below the shield metal 33 is structured as follows.

A $SiO_2$ film 30 having a thickness of 500 nm–1000 nm is formed below a first layer wiring 31 by CVD or thermal oxidation. Since the metallic wiring is composed of two layers in this embodiment, the $SiO_2$ film 30 is formed on the Si semiconductor substrate. The fixed electrode layer 12 which is made of e.g. an alloy of Al—Si and has a thickness of about 700 nm is formed simultaneously with the first layer wiring 31. The first layer wiring is used for the active elements and integrated circuit described above, and serves as an electrode for a transistor, capacitor or resistor and a wiring for connecting these components. An insulating film 32 which may be a $Si_3N_4$ having a thickness of about 400 nm is formed on the first layer wiring 31.

As seen from FIG. 3B, the shield metal 33 may be brought into direct contact with a $P^+$type diffused region (isolated region 41 in this embodiment because it is formed in a bipolar form) connected to GND through a through-hole TH, or otherwise as seen from FIG. 2, it may be brought into contact with a GND region ($P^+$type isolated region 41) of the semiconductor substrate through a first layer shield wiring 40. In the structure shown in FIG. 2, two metal layers inclusive of the shield metal 33 (the wiring constitutes a single metal layer) are provided so that the shield metal 33 constitutes an upper layer and the wiring 31 or shield wiring 40 constitutes a lower layer. According to the number of semiconductor elements to be integrated, three or more layer metal wirings are required. In this case, the shield metal constitutes an uppermost layer and the wiring, electrode, etc. constitute other layers. Further, the insulating layers 30 and 32 may be replaced by a stack of TEOS films and another insulating film as necessary. Additionally, where the shield metal is brought into direct contact with the diffused layer, the through-hole has a high aspect ratio. In this case, using a dual dermathine technique prevents occurrence of voids to provide a reliable embedded structure.

The features of the present invention reside in that as seen from FIG. 1, the shield metal 33 and through-hole TH are used to shield, optically and electrically, the electronic circuit formed in the region between the periphery of the fixed electrode layer 12 and that of the semiconductor substrate 11. In FIG. 1, the hatched line indicates the through-hole TH, and the region encircled by the through-hole TH indicates a region where the electronic circuit 50 is to be formed. First, the light which is incident from an external hole and passes the vibrating film 16, or incident from a gap between the vibrating film 16 and semiconductor substrate 11 is shielded by the shield metal 33 and hence does not reach the underlying electronic circuit. Secondly, an opening or through-hole is formed in the insulating film 32 and filled with the same light-shielding material as the shield metal 33 so that the light incident not only in a vertical direction with respect to the semiconductor substrate but in a horizontal direction by diffusion of light can be shielded (see arrow in FIG. 2). Thirdly, the through-hole TH is formed to surround completely the periphery of the region 50 where the electronic circuit is to be formed so that the completeness of the light-shielding function of the shield metal 33 can be enhanced. These light-shielding functions serves to prevent the malfunction of the electronic circuit.

The light-shielding material embedded in the through-hole preferably reaches the surface of the semiconductor substrate to enhance the completeness of the light-shielding function. As described previously, this can be implemented by directly embedding the material of the shield metal 33 to extend from the surface of the insulating film 32 to the surface of the semiconductor substrate 11 as seen from FIG. 3B, or otherwise by using the multi-wiring structure as shown in FIG. 2. In the case shown in FIG. 2, it is preferred that the shield wiring 40 also encircles the region 50 where the electronic circuit is to be formed.

Specifically, the isolated region 41, shield wiring 40 and contact hole CH which constitutes an opening for contact between the shield wiring 40 and the isolated region 41 are formed in the same pattern as that of the through-hole TH. In addition, the shield metal 33 is formed on the insulating film 32 on the shield wiring 40. The through-hole TH which ex-poses the shield wiring 40 is formed in the insulating film 32. The shield metal 33 is electrically connected to the isolated region 41 through the through-hole TH. Incidentally, the shield wiring 40 and others are partially removed at the areas extending from the pad electrodes 20 to 23 and crossing the first layer wiring, and the first layer wiring passes the removed areas. The shield metal 33 is electrically connected to the isolated region 41 so that it is connected to the ground potential GND.

The fixed electrode layer 12 and vibrating film 16 can be realized as a capacitor without reducing its capacitance as long as they are coincident in shape and completely superposed. However, it is substantially impossible to arrange them with no deviation from each other. For this reason, the vibrating film 16 is made larger than the fixed electrode layer 12 in their sizes. Therefore, even when the vibrating film 16 is shifted slightly, the fixed electrode layer 12 is completely superposed on the vibrating layer 16.

The vibrating film 16 constitutes the one electrode of a capacitor and stores charges. Therefore, the parasitic capacitance will be generated in the wirings or electrodes of the electronic circuit owing to the superposition of the vibrating film 16 on the wirings or electrodes. The parasitic capacitance will lead to a voltage change and noise occurrence. However, in this embodiment, since the shield metal 33 shields the electronic circuit (wiring 31) so that the parasitic capacitance can be removed.

The shield metal 33 is located at the same potential as that at the vibrating film 16. Therefore, no parasitic capacitance is generated between the shield metal 33 and the vibrating film 16. The vibrating film 16 is connected to a GND terminal of a package so that the shield metal 33 is electrically connected to the GND terminal of the package, or otherwise it is connected to GND through the isolated region 41 as seen from FIG. 2.

Figure 6:
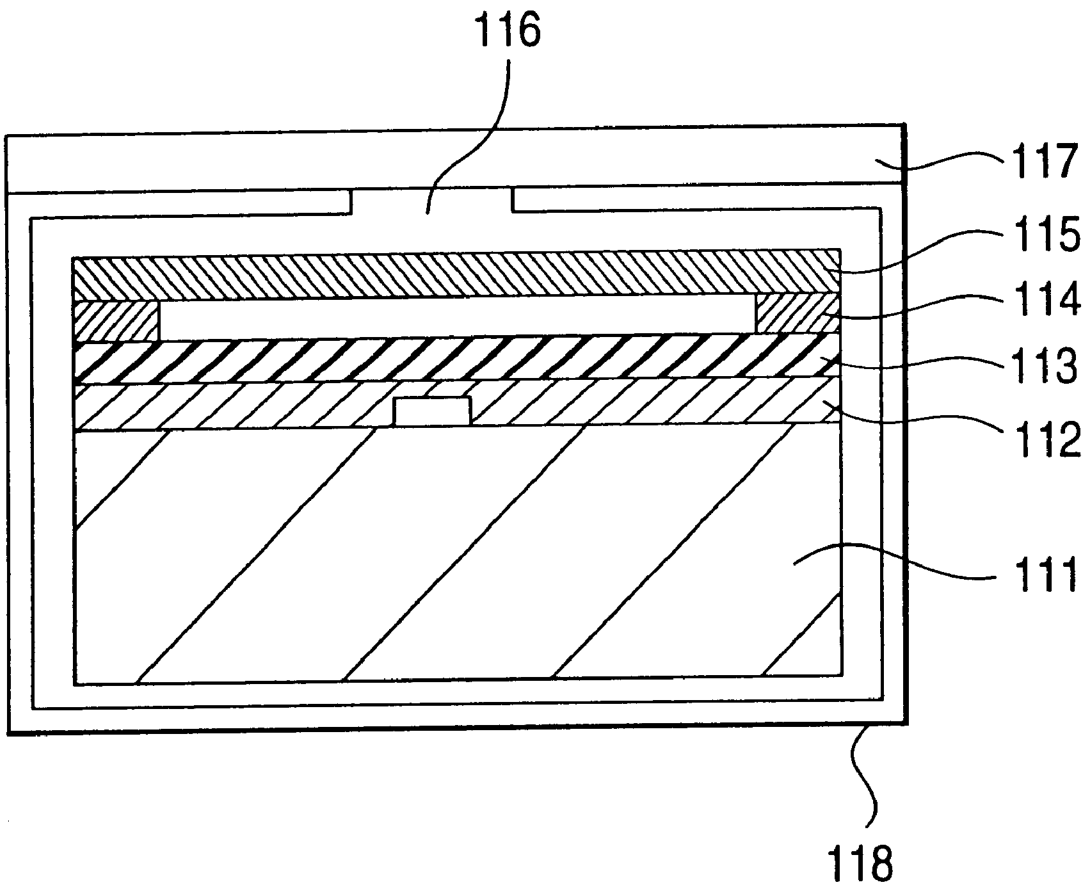
FIG. 6 is a section view of a conventional semiconductor device related to the present invention.

In this embodiment, the though-hole TH is formed so as to encircle completely the region 50 where the electronic circuit is to be formed. However, as seen from FIG. 4 showing an modification of the above embodiment, the through-hole TH may be formed to encircle completely only the inside of the region where the electronic circuit is to be formed. In this case, it is required that the shield wiring is formed only in the though-hole, but not required that the shield wiring is formed outside the electronic circuit. As seen from FIG. 6, the microphone is generally mounted in a package. Therefore, if the package is made of a light-shielding material, external light can be substantially shielded. In such a case, it is only required that the through-hole TH is formed inside the region where the electronic circuit is to be formed and the shield wiring is embedded in the shield wiring.

Further, where the vibrating film is made of a light-shielding material, in order to prevent the light incident from the gap between the vibrating film and the semiconductor substrate from reaching the region 50 where an electronic circuit is to be formed, the outside rather than the inside is preferably shielded. In this case, it is only required that the through-hole TH is formed so as to encircle completely only the outside of the region 50 where an electronic circuit is to be formed and the shield wiring is embedded in the through-hole TH.

Furthermore, as long as the through-hole is made to realize only the electric connection, it may be filled with a light-shielding resin such as epoxy resin rather than the conductive film.

Figure 5:
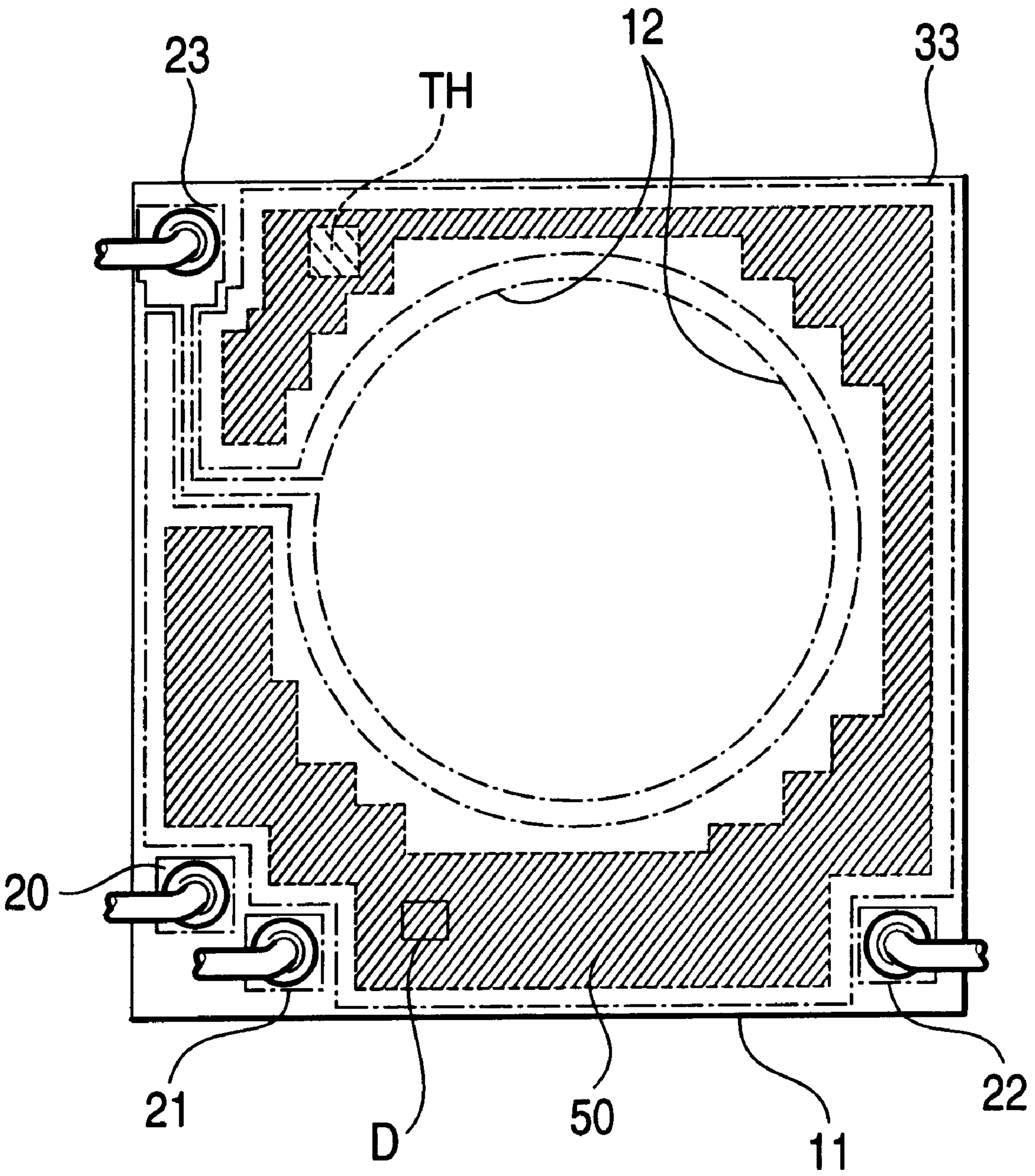
FIG. 5 is a plan view of another modification of the semiconductor device according to the invention.

For example, as seen from FIG. 5 showing another modification of the embodiment, the shield metal may be formed to cover at least the upper surface of the region where an electronic circuit is to be formed. In this case, it is only required that the insulating film is made of the light-shielding material and brought into contact with the semiconductor substrate through at least one through-hole TH.

As understood from the description hitherto made, provision of the shield metal 33 can prevent incidence of light on the electronic circuit and occurrence of the parasitic capacitance between the vibrating film and the electronic circuit. Particularly, if a plurality of wiring layers inclusive of the shield metal 33 and shield wiring 40 are provided, the uppermost shield metal 33, shield wiring 40 and through-hole TH filled with the material of the shield metal can completely shield the electronic circuit. Thus, the light incident not only in a vertical direction with respect to the semiconductor substrate but in a horizontal direction by diffusion of light can be shield. This contributes to prevent the malfunction of the electronic circuit.

The prevention of the occurrence of the parasitic capacitance between the shield metal 33 and the electronic circuit serves to prevent the occurrence of noise and the malfunction of the electronic circuit.

What is claimed is:

1. A semiconductor device comprising: a fixed electrode layer formed on a surface of a semiconductor substrate; an electronic circuit formed on the surface of said semiconductor substrate on the periphery of said fixed electrode layer; and a spacer for attaching a vibrating film which constitutes a capacitor in a pair with said fixed electrode layer, wherein at least an upper surface of said electronic circuit is covered with a shield metal.

2. A semiconductor device according to claim 1, wherein said shield metal is formed at the same potential as that at said vibrating film.

3. A semiconductor device according to claim 1, wherein said shield metal is formed to extend from the upper surface of said electronic circuit to a side surface thereof.

4. A semiconductor device according to claim 1, wherein said shield metal is in contact with a semiconductor region having one conduction type formed in the surface of said semiconductor substrate and connected to ground potential through said semiconductor substrate.

5. A semiconductor device according to claim 1, further comprising: a shield wiring made of a conductor material formed so as to surround said electronic circuit substantially, a first insulating film covering said shield wiring, and an opening in said first insulating film which exposes a surface of said shield wiring, wherein said shield metal is electrically connected to said shield wiring through said opening.

6. A semiconductor device according to claim 5, wherein said shield wiring is a conductive film filled with a through-hole formed in a second insulating film covering the surface of said semiconductor substrate, said shield wiring being formed in a line so as to surround at least an inside region of said electronic circuit.

7. A semiconductor device according to claim 5, wherein said shield wiring is a conductive film filled in a through-hole formed in a second insulating film covering the surface of said semiconductor substrate, said shield wiring being formed in a line so as to surround at least an outside region of said electronic circuit.

8. A semiconductor device according to claim 5, wherein said shield wiring is a conductive film filled in a through-hole formed in a second insulating film covering the surface of said semiconductor substrate, said shield wiring being formed in a line so as to surround an entire periphery of said electronic circuit.

9. A semiconductor device according to claim 5, wherein said fixed electrode layer is arranged substantially centrally on said semiconductor substrate; said shield wiring is composed of an electrode wiring for connecting circuit elements of said electronic circuit to one another and a wiring layer on the same level as said electrode wiring so that it substantially surrounds said electronic circuit.

10. A semiconductor device according to claim 8, wherein a surface of said shield wiring is covered with the first insulating film, said shield wiring being electrically connected to said shield metal through the opening formed in said first insulating film.

11. A semiconductor device comprising:

a semiconductor substrate; a fixed electrode layer arranged substantially centrally on said semiconductor substrate;

an electronic circuit located outside said fixed electrode layer;

an electrode wiring for connecting circuit elements of said electronic circuit, a shield wiring made of a wiring layer on the same level as said electrode wiring and substantially encircling said electronic circuit;

an opening portion which exposes a surface of said shield wiring;

a shield metal which is connected to said shield wiring through said opening portion and covers said electronic circuit; and a spacer for attaching a vibrating film which constitutes a capacitor in a pair with said fixed electrode layer, said spacer being arranged on said semiconductor substrate on the periphery of said fixed electrode layer.

12. A semiconductor device according to claim 1, further comprising: a pad electrode serving as an external electrode of said electronic circuit, wherein said shield metal is partially removed above said pad electrode.

13. A semiconductor device according to claim 1, wherein said shield metal is made of an Al—Si film.

14. A semiconductor device according to claim 1, wherein said shield metal is connected to ground potential GND.

15. A semiconductor device comprising:

a fixed electrode layer formed on a surface of a semiconductor substrate;

an electronic circuit formed on the surface of said semiconductor substrate on the periphery of said fixed electrode layer; and a spacer for attaching a vibrating film which constitutes a capacitor in a pair with said fixed electrode layer, wherein a surface of said semiconductor substrate corresponding to a region where said electronic circuit is formed is covered with an insulating film and said electronic circuit is covered with a shield metal formed on said insulating film; and the same material as said shield metal is continuously extended to the surface of said semiconductor substrate so as to surround the region where said electronic circuit is formed.

* * * * *

UNITED STATES PATENT AND TRADEMARK OFFICE
CERTIFICATE OF CORRECTION

PATENT NO. : 6,417,560 B1
DATED : July 9, 2002
INVENTOR(S) : Shigeaki Okawa et al.

It is certified that error appears in the above-identified patent and that said Letters Patent is hereby corrected as shown below:

Title page,
Item [73], Assignees, please include -- Hosiden Corporation, Osaka, Japan --

Signed and Sealed this

Nineteenth Day of July, 2005

JON W. DUDAS
*Director of the United States Patent and Trademark Office*